(12) United States Patent
Bower et al.

(10) Patent No.: US 6,639,724 B2
(45) Date of Patent: Oct. 28, 2003

(54) DEVICE HAVING A BARRIER LAYER LOCATED THEREIN AND A METHOD OF MANUFACTURE THEREFOR

(75) Inventors: John Eric Bower, North Plainfield, NJ (US); Michal E. Gross, Summit, NJ (US); Sungho Jin, Millington, NJ (US); Hareesh Mavoori, Piscataway, NJ (US); Ainissa Ramirez, Hoboken, NJ (US)

(73) Assignees: Lucent Technologies Inc., Murray Hill, NJ (US); Agere Systems Optoelectronics Guardian Corporation, Orland, FL (US)

( * ) Notice: Subject to any disclaimer, the term of this patent is extended or adjusted under 35 U.S.C. 154(b) by 23 days.

(21) Appl. No.: 09/874,838

(22) Filed: Jun. 5, 2001

(65) Prior Publication Data

US 2002/0181110 A1 Dec. 5, 2002

(51) Int. Cl.[7] .......................... G02B 13/20; G02B 26/00
(52) U.S. Cl. .................... 359/599; 359/296; 359/871
(58) Field of Search ........................... 359/224–226, 359/296–299, 599, 702, 838, 821, 883; 362/31; 349/52–64

(56) References Cited

U.S. PATENT DOCUMENTS

| 4,775,222 A | * | 10/1988 | Ohe ........................... 427/161 |
| 6,008,871 A | * | 12/1999 | Okumura ..................... 349/61 |
| 6,107,115 A | * | 8/2000 | Atobe et al. .................. 438/72 |
| 6,215,579 B1 | * | 4/2001 | Bloom et al. ............... 359/298 |

* cited by examiner

*Primary Examiner*—Thong Nguyen

(57) ABSTRACT

A device for use in a micro-electro-mechanical system (MEMS) optical device. The device includes a substrate having opposing first and second sides and a diffusion barrier layer formed over at least the first side. The device further includes a light reflective optical layer formed over the diffusion barrier layer on the first side of the substrate. The second side may desirably have a stress balancing layer located thereover.

20 Claims, 9 Drawing Sheets

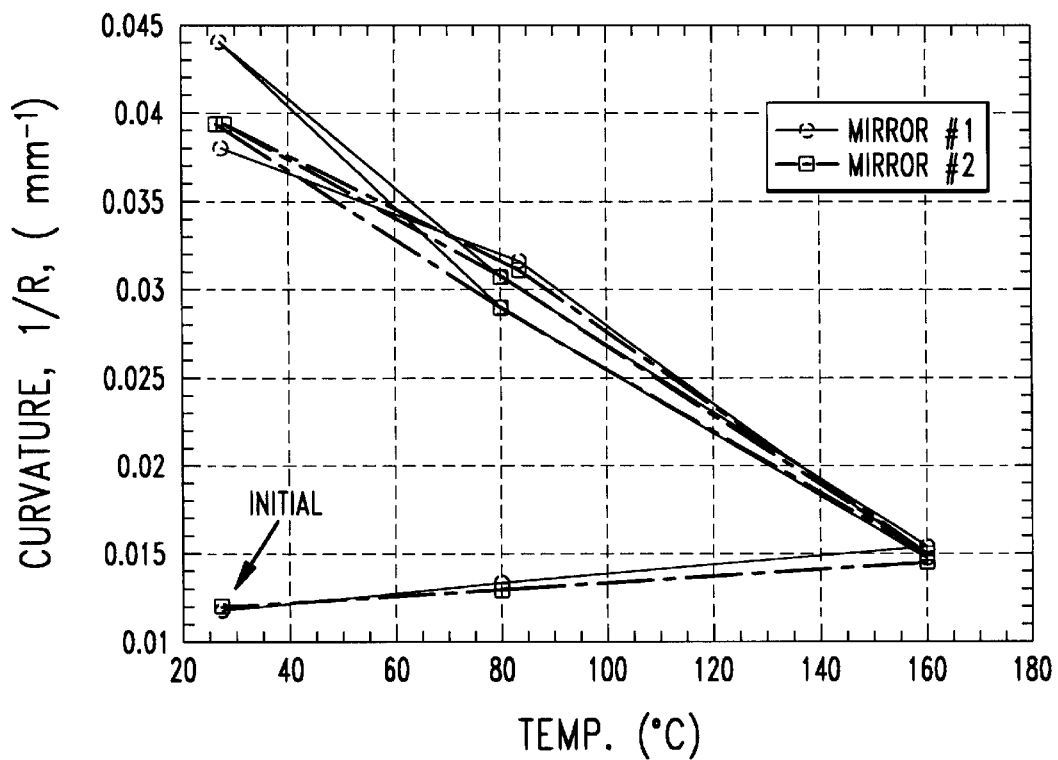

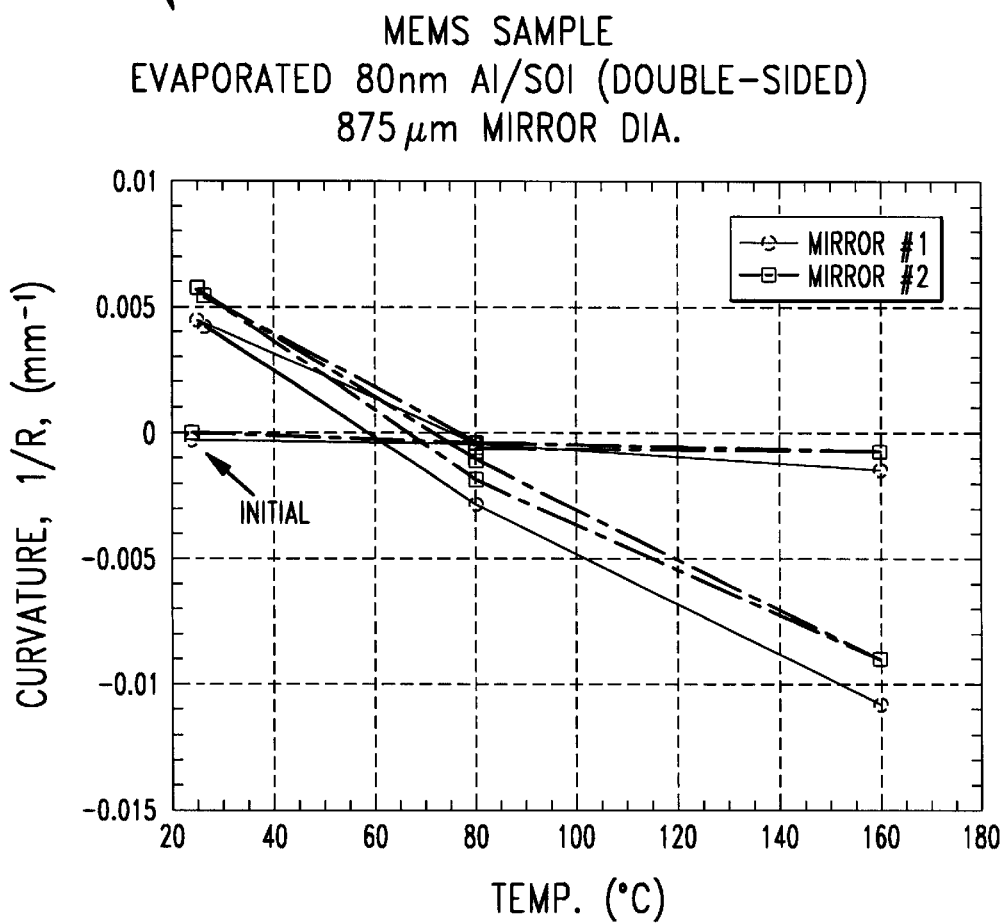
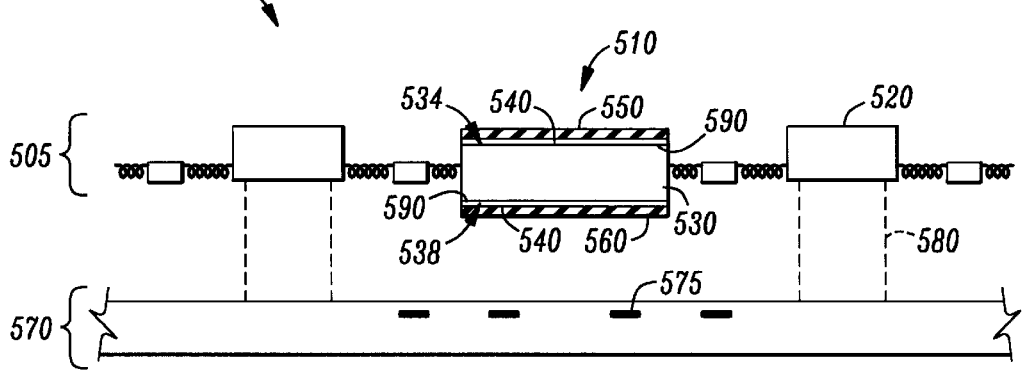

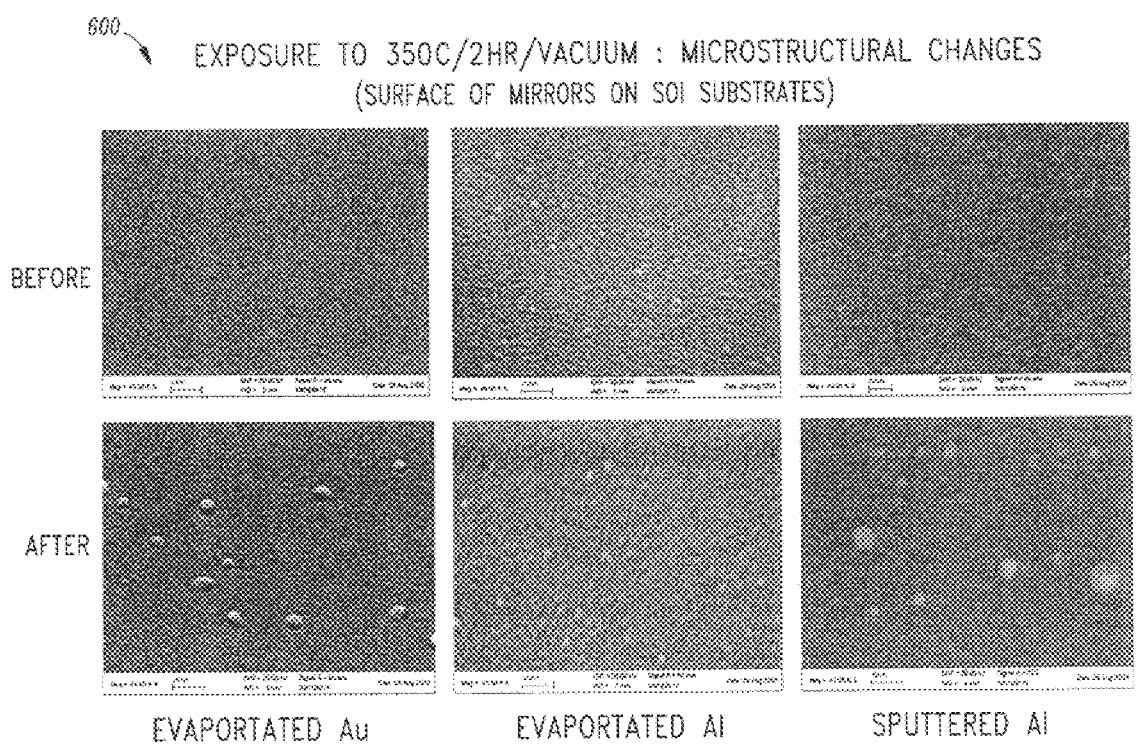

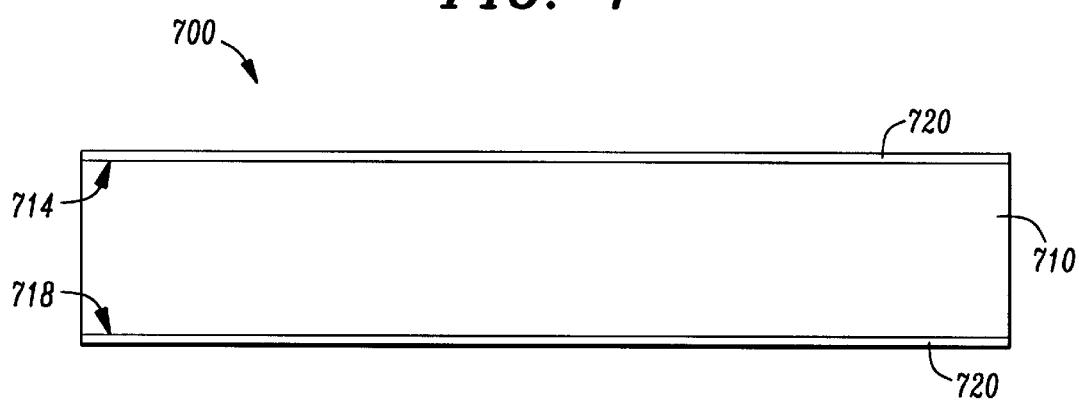
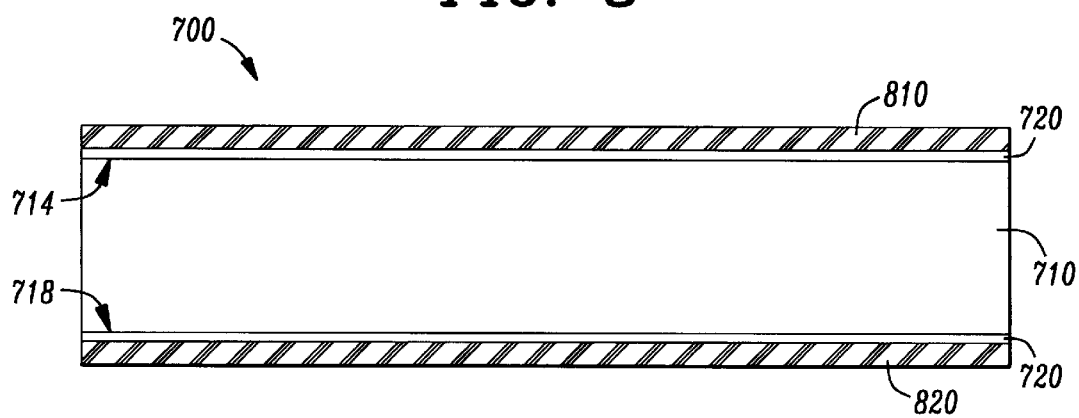

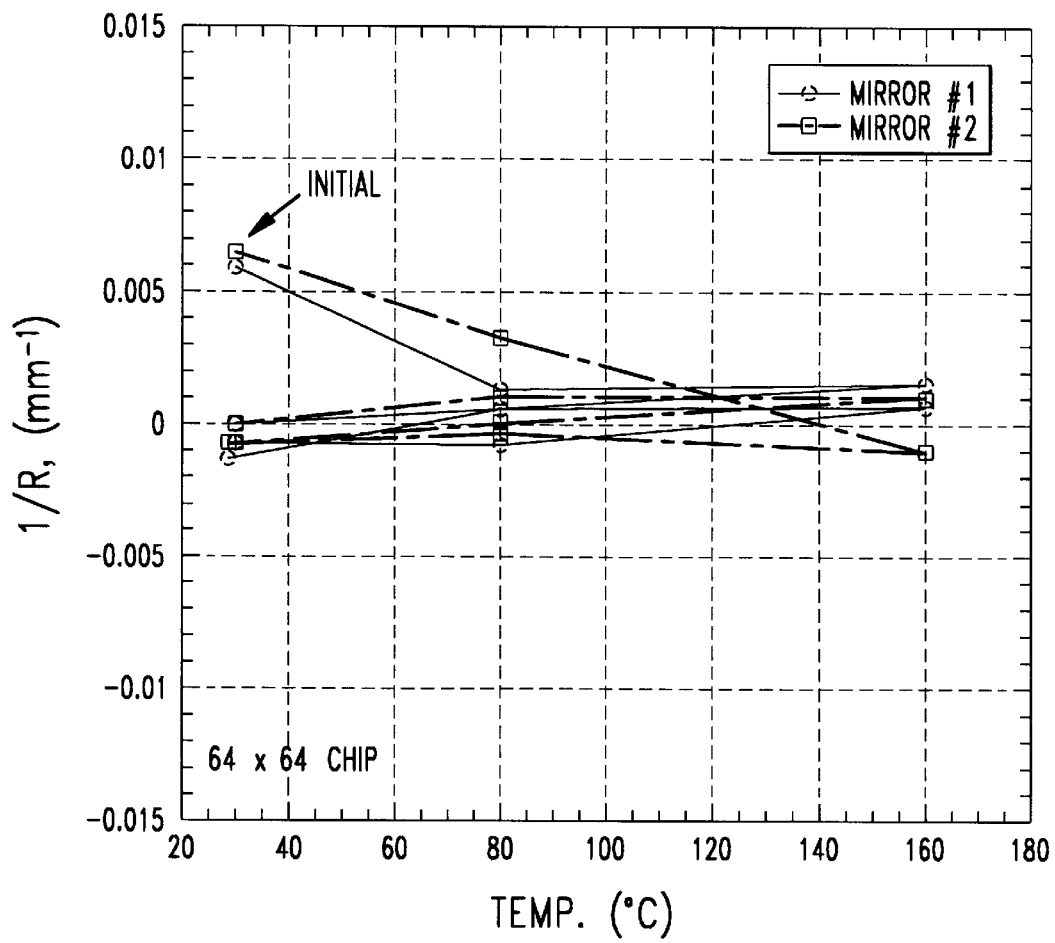

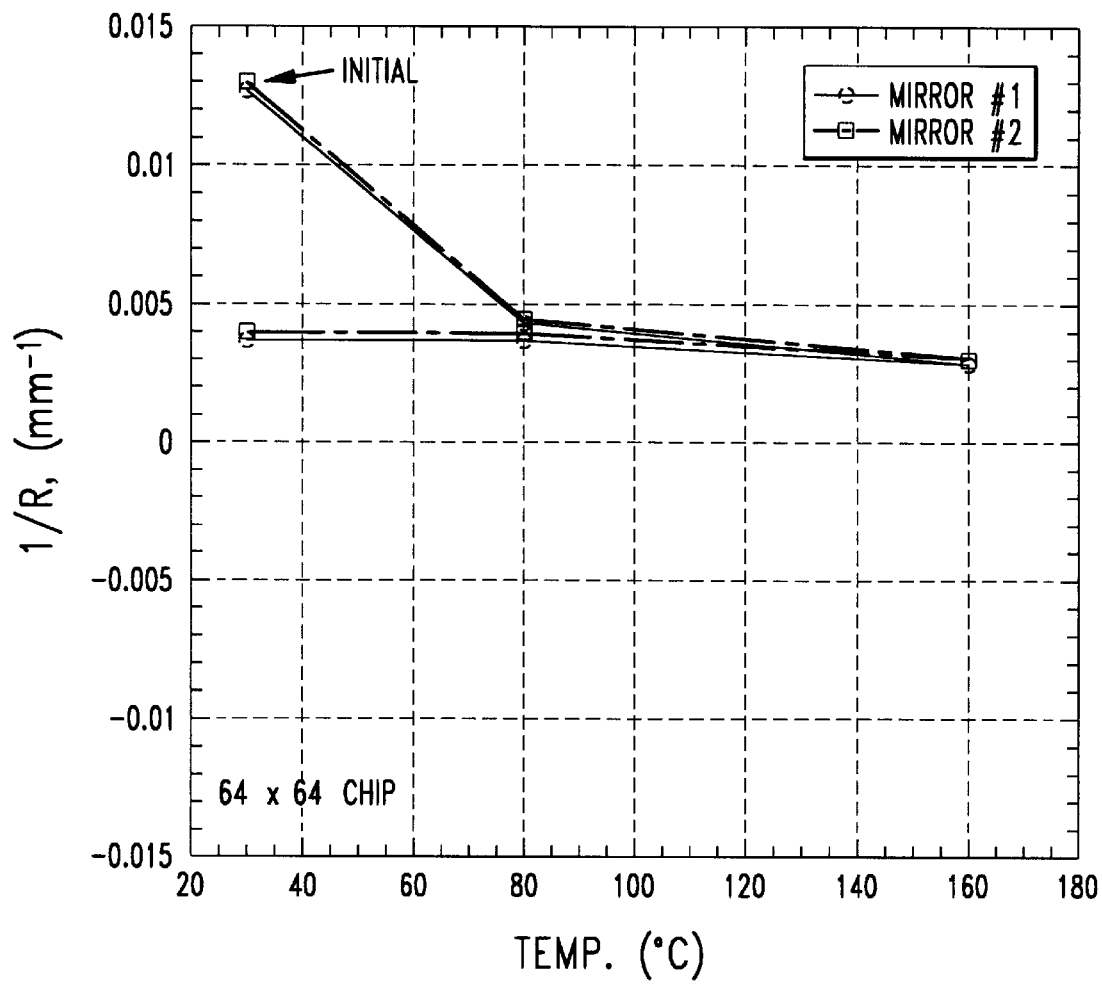

DEVICE HAVING A BARRIER LAYER LOCATED THEREIN AND A METHOD OF MANUFACTURE THEREFOR

TECHNICAL FIELD OF THE INVENTION

The present invention is directed, in general, to an optical device and, more specifically, to a mirror having a barrier layer located therein or an array of mirrors having barrier layers located therein, and a method of manufacture therefor.

BACKGROUND OF THE INVENTION

Optical communication systems typically include a variety of optical devices, for example, light sources, photo detectors, switches, cross connects, attenuators, modulators, mirrors, amplifiers, and filters. The optical devices transmit optical signals in the optical communications systems. Some optical devices are coupled to electro-mechanical structures, such as thermal actuators, forming an electro-mechanical optical device. The term electro-mechanical structure, as used herein, refers to a structure that moves mechanically under the control of an electrical signal.

Some electro-mechanical structures move the optical devices from a predetermined first position to a predetermined second position. Cowan, William D., et al., "Vertical Thermal Actuators for Micro-Opto-Electro-Mechanical Systems," SPIE, Vol. 3226, pp. 137–146 (1997), describes one such electro-mechanical structure useful for moving optical devices in such a manner.

These micro-electro-mechanical systems (MEMS) optical devices often employ a periodic array of micro-machined mirrors, each mirror being individually movable in response to an electrical signal. For example, the mirrors can each be cantilevered and moved by an electrostatic, piezoelectric, magnetic, or thermal actuation. See articles by L. Y. Lin, et al., IEEE Photonics Technology Lett. Vol. 10, p. 525, 1998, R. A. Miller, et al. Optical Engineering Vol. 36, p. 1399, 1997, and by J. W. Judy et al., Sensors and Actuators, Vol.A53, p.392, 1996, which are incorporated herein by reference.

The mirrors used in these optical devices are typically made up of a material which reflects light with high reflectivity at a desired operating wavelength of the light, for example an operating wavelength ranging from about 1000 nm to about 1600 nm for $SiO_2$ optical fiber-based telecommunication systems. Some examples of such reflective materials are gold, silver, rhodium, platinum, copper, aluminum and their alloys. These reflective metal films typically have a thickness ranging from about 20 nm to about 2000 nm, and are deposited on a movable membrane substrate such as a polysilicon or silica substrate. At least one adhesion-promoting bond layer is desirably added between the reflective metal film and the substrate in order to prevent the reflective metal film from getting peeled off. Examples of such adhesion-promoting bond layers include titanium, zirconium, hafnium, chromium and tantalum.

A typical MEMS mirror comprises a metal-coated silicon mirror movably coupled to a surrounding silicon frame via a gimbal. Two torsional members on opposite sides of the mirror connect the mirror to the gimbal, and on opposite sides of the mirror, defining the mirror's axis of rotation. The gimbal, in turn, is coupled to the surrounding silicon frame via two torsional members defining a second axis of rotation orthogonal to that of the mirror. Using the typical MEMS mirror, the light beam can be reflected and steered in any direction.

Commonly, electrodes are disposed in a cavity underlying the mirror and the gimbal. Voltages applied between the mirror and an underlying electrode, and between the gimbal and an electrode, electrostatically control the orientation of the mirror. Alternatively, an electrical current can control the position of the mirror magnetically, thermally or piezoelectrically.

Turning to Prior Art FIGS. 1 and 2, illustrated is a typical MEMS mirror device and its application. FIG. 1 illustrates a prior art optical MEMS mirror device 100. The device 100 comprises a mirror 110 coupled to a gimbal 120 on a polysilicon frame 130. The components are fabricated on a substrate (not shown) by micromachining processes such as multilayer deposition and selective etching. After etching, the mirror 110, the gimbal 120 and the polysilicon frame 130, are raised above the substrate by upward bending lift arms 140, typically using a release process. The mirror 110 in the example illustrated in FIG. 1, is double-gimbal cantilevered and attached onto the polysilicon frame 130 by springs 150. The mirror 110 can be tilted to any desired orientation for optical signal routing via electrostatic or other actuation, using electrical voltage or current supplied from outside. Typically, the mirror 110 includes a light-reflecting mirror surface 160 coated over a polysilicon membrane 170, which is typically of circular shape. The light-reflecting mirror surface 160 is generally deposited by known thin film deposition methods, such as evaporation, sputtering, ion-beam, electrochemical or electroless deposition, or chemical vapor deposition.

Turning briefly to Prior Art FIG. 2, illustrated is an important application of the mirror 110 illustrated in FIG. 1. FIG. 2 illustrates an optical cross connect system 200 for optical signal routing, including an array of mirrors 210. The optical cross connect system 200 shown in FIG. 2 includes an optical input fiber 220, an optical output fiber 230 and the array of MEMS mirrors 210, including a primary mirror 212 and an auxiliary mirror 215. As is illustrated, an optical signal from the input fiber 220 is incident on the primary mirror 212. The primary mirror 212, with the aid of the auxiliary mirror 215, is electrically controlled to reflect the incident optical signal to the optical output fiber 230. In alternative schemes, the input fibers and the output fibers are in separate arrays, and a pair of MEMS mirror arrays are used to perform the cross connect function.

The tilting of each mirror is controlled by applying specific electric fields to one or more of the electrodes beneath the mirror. Undesirable variations in the gap spacing between the mirror layer and the electrode layer, symmetric or nonsymmetric, may alter the electric field for the applied field, which affects the degree of electrostatic actuation and hence the degree of mirror tilting. This, in turn, alters the path or coherency of light signals reaching the receiving fibers, thus increasing the signal loss during beam steering.

An array of such MEMS mirrors is essentially composed of two layers: a mirror layer comprising the array of mirror elements movably coupled to a surrounding frame, and an actuator layer comprising the electrodes and conductive paths needed for electrical control of the mirrors. One approach to fabricating the array is to fabricate the actuator layer and the mirror layer as successive layers on the same workpiece and then to lift up the mirror layer above the actuator layer using vertical thermal actuators or using stresses in thin films.

An alternative approach is to fabricate the mirror layer on one substrate, the actuator layer on a separate substrate and then to assemble the mating parts with accurate alignment and spacing. A two-part assembly process is described in U.S. Pat. No. 5,629,790 issued to Neukermans et al. on May 13, 1997, which is incorporated herein by reference. Such two-part assembly processes generally provide a more robust structure, greater packing density of the movable mirrors, and permits larger mirror sizes and rotation angles, in addition to being easily scalable for larger arrays using silicon fabrication processes. The movable membrane in such a MEMS device is preferably made of single crystal silicon, and is typically only several micrometers thick. Such a thin silicon membrane is made, for example, by using the well-known silicon-on-insulator (SOI) fabrication process. The SOI process allows a convenient way of fabricating a thin silicon membrane, and the presence of a buried oxide layer is useful as an etch-stop barrier in photolithographical fabrication of the mirror, gimbal and spring/torsion bar structures. Selected patterned areas of the SOI substrate are etched, e.g., by using chemical etch, reactive-ion etch, or a combination of these processes to form the mirror array pattern with cavity structure. The gimbals and the torsion bars are also formed around each mirror. The SOI material and process are described, for example, in *Concise Encyclopedia of Semiconducting Materials and Related Technologies,* Edited by S. Mahajan and L. C. Kimmerling, Pergamon Press, New York, 1992, p. 466.

Various challenges and problems currently exist with the above-mentioned MEMS devices. Solutions to these and other problems are presently being sought. Accordingly, what is needed in the art is a micro-electro-mechanical system optical device, and a method of manufacture therefore, that does not encounter the problems of the prior art devices.

SUMMARY OF THE INVENTION

To address the above-discussed deficiencies of the prior art, the present invention provides a device for use in a micro-electro-mechanical system (MEMS) optical device. The device includes a substrate having opposing first and second sides and a diffusion barrier layer formed over the first side. The device further includes a light reflective optical layer formed over the diffusion barrier layer on the first side of the substrate.

The present invention is further directed to a method of manufacturing the device. The method includes (1) providing a substrate having a first and second side, (2) forming a diffusion barrier layer over the first side, and (3) forming a light reflective optical layer over the diffusion barrier layer over the first side of the substrate.

The foregoing has outlined, rather broadly, preferred and alternative features of the present invention so that those skilled in the art may better understand the detailed description of the invention that follows. Additional features of the invention are described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

Prior Art

Prior Art

FIG. 3 illustrates a graph that depicts experimental data showing mirror curvature and temperature dependent change problems arising from the use of single-sided metallization on a Si MEMS membrane;

FIG. 4 illustrates experimental data showing the undesirable curvature that may still occur during temperature cycling, when using the double-sided metallization on the Si MEMS membrane;

FIG. 5 illustrates one embodiment of a completed micro-electro-mechanical system (MEMS) optical device, including a mirror, which is in accordance with the present invention;

FIG. 6 illustrates micro structural changes that may occur by forming a light reflective optical layer on a silicon substrate, in accordance with the present invention;

FIG. 7 illustrates a cross-sectional view of a partially completed mirror, including a mirror substrate, using a preferred embodiment to manufacture the completed mirror depicted in FIG. 5;

FIG. 8 illustrates a light reflective optical layer formed directly on the diffusion barrier layer using a preferred embodiment to manufacture the completed mirror depicted in FIG. 5;

FIG. 9 illustrates a reduced temperature dependent curvature that may be achieved by forming a barrier layer on both sides of a mirror substrate, showing curvature of the mirror versus temperature for several temperature cycles, when using a palladium barrier layer on both sides, and aluminum for the light reflective optical layer and the stress balancing layer;

FIG. 10 illustrates a reduced temperature dependent curvature that may be achieved by forming a barrier layer on both sides of a mirror substrate, showing curvature of the mirror versus temperature, when using a platinum barrier layer, and aluminum for the light reflective optical layer and the stress balancing layer;

DETAILED DESCRIPTION

Figure 1:
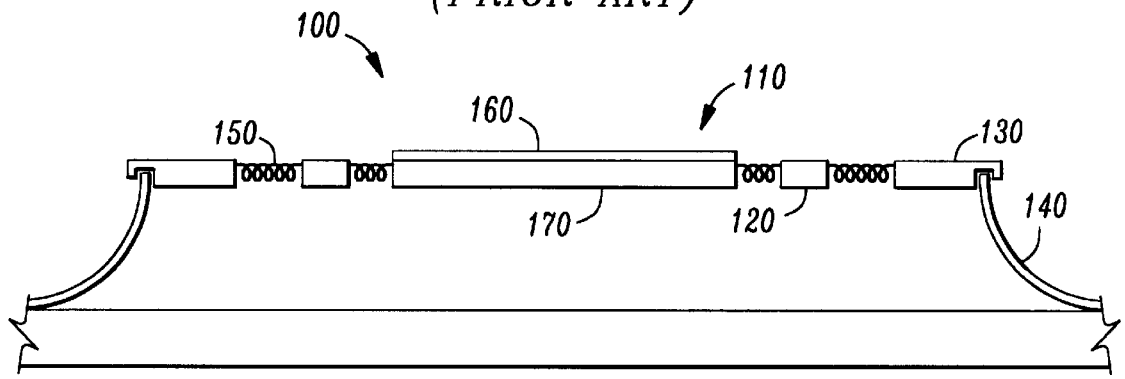
FIG. 1 illustrates a traditional surface-micromachined-type MEMS device.
Figure 2:
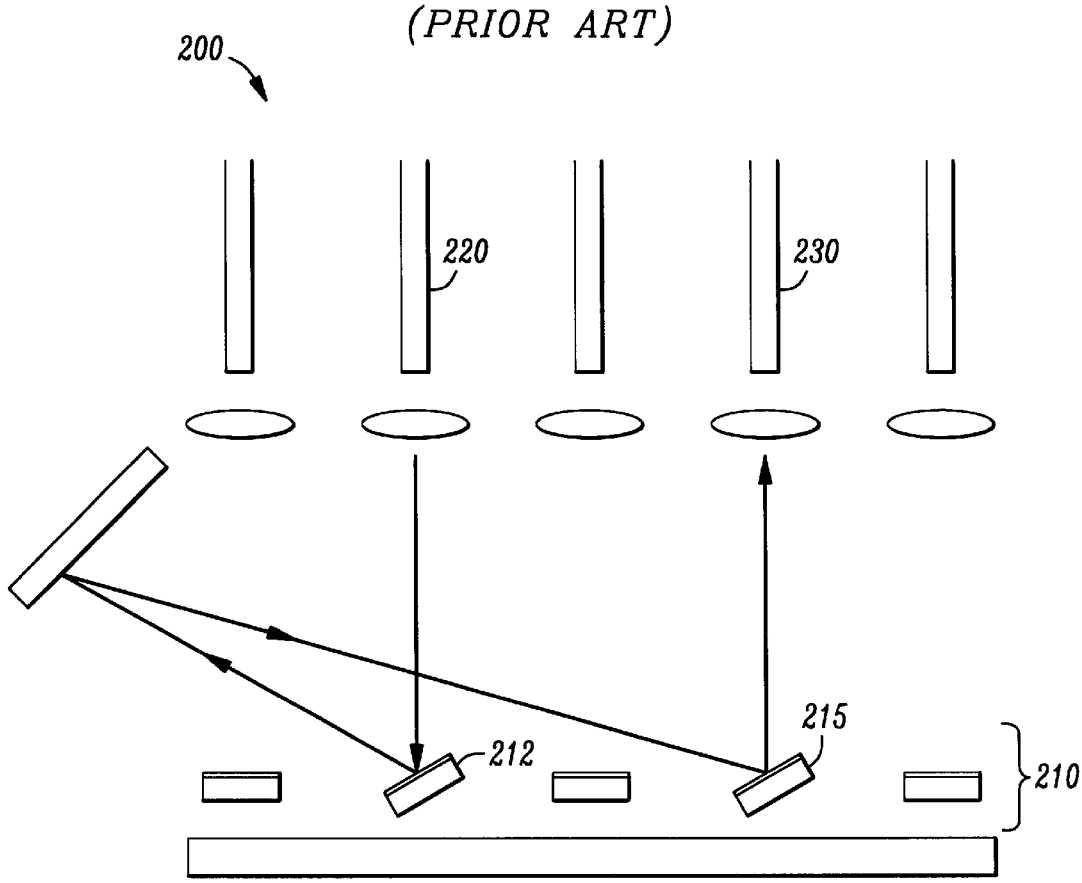
FIG. 2 illustrates an optical cross connect system for optical signal routing, including an array of traditional surface-machined-type MEMS device.

In surface-micro-machined optical MEMS devices, such as optical cross-connects, the movable mirrors are often made of poly-silicon membranes, and are coated with a light-reflecting metal such as gold or aluminum on the top surface, with associated adhesion layers. It has been found that the deposition of such metallization films introduces stresses in the mirror, which tends to cause undesirable mirror curving. This may be due to a number of different reasons, such as a film-substrate mismatch in the coefficient of thermal expansion (CTE), a mismatch in the lattice parameter, nonequilibrium atomic arrangement in the film, inadvertent or intentional incorporation of impurity atoms, etc. The presence of such stresses tends to cause a variety of dimensional instability problems, especially if the substrate is relatively thin, as is the case in the MEMS membranes, which are usually only several-micrometers thick. Other examples of the stress caused dimensional problems in the MEMS mirror structure, may include: i) undesirable bowing of the mirror substrate (membrane), which results in a non-focused or nonparallel light reflection and an increased loss of optical signal, ii) time-dependent change in mirror curvature due to the creep or stress relaxation in the reflective metal film, bond layer or the membrane substrate, and iii) temperature-dependent change in mirror curvature due to the altered stress states and altered CTE mismatch conditions in the metal film, bond layer, and membrane substrate materials, with changing temperature.

Turning initially to FIG. 3, shown is a graph 300 that illustrates experimental data depicting mirror curvature and temperature dependent change problems arising from the use of a conventional Si MEMS membrane having metallization on a single side. In the particular experiment depicted in FIG. 3, a 40 nm gold layer and 4 nm titanium adhesion layer were formed on a 3000 nm silicon substrate. As is evident from FIG. 3, the single-sided metallization produces undesirable mirror curvature as well as a severe temperature-dependent change in curvature, both of which are undesirable for light beam steering applications such as optical cross-connects. In the current example, the primary reason for the curvature formation is most likely the stress caused by the substantial mismatch in the coefficient of thermal expansion (CTE) between the Si membrane (about $4 \times 10^{-6}/°$ C.) and the metallization (about $14 \times 10^{-6}/°$ C.), although the film growth-related stresses may also contribute.

Achieving a flat mirror with a small curvature is essential in order to minimize optical losses associated with such non-flat mirrors. In addition, ensuring a small curvature with a low or negligible temperature dependence of mirror curvature is important, as the optical MEMS mirrors are often subjected to high temperature exposure for the purpose of assembly, packaging and other manufacturing processes, as well as to fluctuations in ambient temperature during operation. It has been found that one way of correcting such curvature and restoring flat mirror geometry is to employ ion implantation which introduces a compressive stress to cancel out the existing tensile stress in the curved (often concave upward) mirrors. See U.S. patent application Ser. No. 09/685,883, filed Oct. 10, 2000.

An undesirable mirror curvature in one-side metallized silicon membrane is also seen in the case of the two-part MEMS assembly structure where the mirror layer is, for example, made of the single crystal silicon membrane fabricated from the SOI substrate, and is then subsequently bonded to the electrode layer to form the actuateable MEMS device. However, in this case, both sides of the mirror layer are available for metallization, and it has been found that the mirror curvature problem can thus be resolved through using a double-layered metallization, i.e., by depositing the same metallization in exactly the same thickness onto both the top and the bottom surface of the silicon membrane, so that the metallization-induced stresses are balanced. However, it has also been found that mirrors having the double sided metallization still experience an undesirable amount of curvature at ambient temperature, especially after exposure to elevated temperatures (e.g., greater than about 120° C.), as well as temperature dependent curvature.

Turning briefly to FIG. 4, shown is a graph 400 that illustrates experimental data showing the temperature dependent curvature that may still exist, even though the metallization is formed on both sides of the mirror substrate. In the particular experiment depicted in FIG. 4, an 80 nm aluminum layer is formed on either side of a silicon substrate. As is illustrated, the double sided metallization initially corrects the mirror curvature problem, however, the mirror still experiences substantial temperature dependent curvature, and eventual remnant curvature at ambient temperature, when subjected to various temperature cycles ranging from about 20° C. and about 160° C.

While the exact cause is not clearly understood, it is likely that such non-symmetrical behavior of top and bottom surfaces of the silicon membrane may be caused by the non-symmetrical nature of the SOI fabrication, which involves the presence of a silicon dioxide layer on only one side. At some point during the fabrication process, often the oxide layer etching step, a different nature of the Si membrane surface is produced.

Alternatively, the nature of the epitaxially added Si layer on one side of the SOI silicon, during SOI fabrication, may be sufficiently different from the original Si on the other side. Such a different nature in the surface condition tends to cause non-equal degree of metallurgical reaction between the metallization such Al and the Si substrate during heating and cooling cycle, and hence introduces a different type or extent of interface stresses, thus contributing to membrane curvature. It is therefore desirable to equalize the surface states of the top versus bottom surfaces of the membrane to either minimize or induce equal degree of interfacial reactions, for example, by introducing a diffusion barrier as taught in this patent application.

The present invention provides a MEMS mirror that generally does not experience the temperature dependent curvature found in the devices above. Turning to FIG. 5, illustrated is such a device. FIG. 5 illustrates one embodiment of an exemplary two-part optical MEMS device 500, including an actuating layer 505 having a mirror 510. As illustrated in FIG. 5, the actuating layer 505 includes the mirror 510 and a mounting substrate 520, on which the mirror 510 is moveably mounted. The mirror 510 comprises a substrate 530 having first and second sides 534, 538, respectively. Located over at least the first side 534, and possibly over the second side 537 as well, is a diffusion barrier layer 540. Another embodiment may include an adhesion layer 590 that is located between the first or second sides 534, 538, and the barrier layer 540. The mirror 510 further includes a light reflective optical layer 550 located over the first side 534 of the substrate 530. In the illustrative embodiment shown in FIG. 5, a stress balancing layer 560 is further located over an opposite side of the mirror substrate 530 as the light reflective optical layer 550 is located. The stress balancing layer 560 may comprise the same material or a different material as the light reflective optical layer 550. It should further be noted that the barrier layer 540 may be formed between the stress balancing layer 560 and the mirror substrate 530, as illustrated in FIG. 5. While most embodiments will be discussed with respect to first and second sides, it should be noted that reference to the first and second sides is without respect to orientation and that the invention is not limited by a specific orientation.

The two-part optical MEMS device 500 may further include an electrode layer 570, including at least one actuating electrode 575, and leads (not shown), for applying voltage between the electrode 575 and the mirror 510. The actuating layer 505 is shown mechanically attached, e.g., by solder bonding or epoxy bonding, to the electrode layer 570 with a controlled vertical gap spacing, which can be controlled, e.g., by using a fixed thickness spacer 580.

It is well known in the art that forming certain materials, including some of the materials used as reflective surfaces in MEMS mirrors, over silicon substrates, tends to result in some interdiffusion of the material into the silicon substrate. Turning briefly to FIG. 6 shown is an illustration 600 depicting microstructural changes that may occur to a silicon substrate when materials, such as gold and aluminum, are formed thereover. Three examples are shown, all of which experience a certain level of microstructural changes to the silicon substrate when the material is formed thereon, and subsequently subjected to high temperature exposure, e.g., as exposed during packaging purposes. For example, after an anneal at 350° C. for 2 hours, the evaporated gold, evaporated aluminum and sputtered aluminum all experience certain microstructural changes. As noticed, the microstructural changes are particularly significant in the evaporated gold and the sputtered metal examples.

What is not well known, and what has been discovered herein, is that when a light reflective layer, for example gold, silver or aluminum, is formed on opposing surfaces of the silicon substrate, differing amounts of microstructural changes may occur to each of the opposing surfaces. It has further been found that such differing amounts of microstructural changes, e.g., differing amounts of diffusion and/or interaction, may induce curvature during temperature cycling.

The inclusion of the diffusion barrier layer 540 between the first and second sides 534, 538 of the substrate and the light reflective optical layer 550 and the stress balancing layer 560, respectively, substantially reduces the number and extent of the microstructural changes caused by diffusion. For example, in an exemplary embodiment the diffusion barrier layer 540 reduces the number of diffusing atoms of metallization material or silicon reaching the other material across the diffusion barrier layer 540 by more than about 80% as compared to the case of no barrier, preferably more than about 95%, and even more preferably more than about 99%. Because the mirror 510 may be manufactured having a reduced amount of temperature dependent curvature as a result of the reduced diffusion, many of the optical loss issues experienced by the prior art devices may be eliminated.

Turning to FIGS. 7–8, with continued reference to FIG. 5, illustrated are detailed manufacturing steps instructing how one might, in a preferred embodiment, manufacture the mirror 510 depicted in FIG. 5. FIG. 7 illustrates a cross-sectional view of a partially completed mirror 700, including a mirror substrate 710. As illustrated, the mirror substrate 710 includes a first side 714 and a second side 718. In an exemplary embodiment, the mirror substrate 710 is a single crystal silicon substrate, however, it should be noted that other substrates known to those who are skilled in the art could be used. For example, poly silicon, silicon nitride, silicon carbide, silicon oxide, diamond film, metals or any combination of these materials may be used as the mirror substrate 710. In an exemplary embodiment, the mirror substrate 710 has a thickness that ranges from about 1000 nm to about 10000 nm.

Desirably formed over the first or second sides 714, 718, of the mirror substrate 710, depending on design, is a diffusion barrier layer 720. If a light reflective barrier layer is formed over the first side 714 of the mirror substrate 710 in a subsequent step, then the diffusion barrier layer 720 should be located between the light reflective barrier layer and the first side 714 of the mirror substrate 710. Likewise, if a stress balancing layer is formed over the second side 718 of the mirror substrate 710 in a subsequent step, then the diffusion barrier layer 720 should be located between the stress balancing layer and the second side 718 of the mirror substrate 710. In an exemplary embodiment, the diffusion barrier layer 720 is located on both the first and second side 714, 718, of the mirror substrate 710, and the light reflective optical layer and stress balancing layer will be formed thereover in a subsequent step.

It should be noted that while the diffusion barrier layer 720 is shown formed on the first and second sides 714, 718, of the mirror substrate 710, one skilled in the art understands that one or more layers, e.g., adhesion layers, could be interposed therebetween in order to prevent the diffusion barrier layer 720 from peeling off the mirror substrate 710. This is particularly important if a noble metal based material is used for the diffusion barrier layer 720, such as palladium and platinum. The chemical inertness of these metals generally results in poor adhesion onto the mirror substrate 710. Exemplary adhesion-promoting layers may comprise niobium, chromium, titanium, zirconium or hafnium. A desired thickness of the adhesion layer ranges from about 1 nm to about 100 nm and more preferably from about 2 nm to about 20 nm. It should be noted, however, that with or without the adhesion layer, the diffusion barrier layer 720 substantially reduces any diffusion between subsequently formed layers and the mirror substrate 710.

The diffusion barrier layer 720 may comprise many types of materials, while inhibiting diffusion from a layer located thereon into the mirror substrate 710 located thereunder. In an exemplary embodiment, the diffusion barrier layer 720 comprises a metal, such as a refractory metal or platinum group metal selected from the group of materials consisting of tungsten, molybdenum, zirconium, niobium, hafnium, platinum, palladium, rhodium, iridium, osmium or any alloys containing at least about 30 atomic percent thereof. Additionally, the diffusion barrier layer 720 may comprise an oxide, nitride, carbide, or fluoride selected from the group of materials consisting of magnesium oxide, calcium oxide, titanium dioxide, aluminum oxide, chromium oxide, zirconium dioxide, silicon nitride, aluminum nitride, titanium nitride, zirconium nitride, hafnium nitride, tungsten carbide, silicon carbide, zirconium carbide, titanium carbide, magnesium fluoride, or calcium fluoride. Likewise, the diffusion barrier layer 720 may comprise a carbon based material, such as a diamond-like material. While many examples of materials that could be used to form the diffusion barrier layer 720 have been listed, it should be noted that the diffusion barrier layer 720 is not limited to the materials discussed above, and that other applicable materials may be found in the CRC Handbook of Chemistry and Physics, CRC Press, Boston, 1991.

The diffusion barrier layer 720 may have a wide range of thicknesses, although, in one embodiment the diffusion barrier layer 720 has a thickness ranging from about 0.5 nm to about 500 nm. It should be noted, however, in another particularly advantageous embodiment, the diffusion barrier layer 720 has a thickness ranging from about 5 nm to about 50 nm. One skilled in the art understands how to form the diffusion barrier layer 720, including known thin film deposition methods such as evaporation, sputtering, electrochemical deposition, electroplating, electroless plating, chemical vapor deposition or another similar method.

In one particular example of forming the diffusion barrier layer 720, the mirror substrate 710 could initially be cleaned in dilute HF immediately prior to introduction of the mirror substrate 710 into a metal deposition system. For example, the metal deposition system could comprise a Novellus M2000 Sputter Deposition System, or another similar system. An aluminum oxide film could then be formed by sputtering aluminum from an aluminum target using an argon plasma in the presence of a low flow of oxygen. The processing conditions obtained within the metal deposition system, in one embodiment, could be as follows: an argon flow rate of about 80 sccm, an oxygen ($O_2$) flow rate of about 40 sccm, a pressure of about 3.5 mTorr, a power of about 2.8 kW, and a temperature of about 400° C.

In the example illustrated in the paragraph above, a change in stress after cycling to a temperature of about 400° C., is only about +25 Mpa in the tensile direction. This is in contrast to a change in stress after cycling to a temperature of about 400° C., of about +300 Mpa, if forming the light reflective layer directly on the mirror substrate 710.

Turning to FIG. 8, illustrated is the formation of a light reflective optical layer 810 over a first side 714 of the mirror substrate 710. In the specific embodiment shown in FIG. 8, the light reflective optical layer 810 is formed directly on the diffusion barrier layer 720. In an alternative exemplary embodiment, a stress balancing layer 820 may be formed over the second side 718 of the wafer substrate 710. In the embodiment shown in FIG. 8I the stress balancing layer 820 is located on an opposite side of the mirror substrate 710 as the light reflective optical layer 810 and over the diffusion barrier layer 720.

In one illustrative embodiment of the present invention, the stress balancing layer 820 and the light reflective optical layer 810 comprise a similar material with a similar thickness, so as to closely counterbalance any stress caused by the light reflective optical layer 810. Additionally, the light reflective optical layer 810 and the stress balancing layer 820 may be formed one at a time, or in an exemplary embodiment, formed concurrently. The stress balancing layer 820 substantially reduces many of the mirror curvature and temperature dependent change problems arising from the use of single-sided metallization mirrors.

The light reflective optical layer 810 and the stress balancing layer 820 may comprise any material that is generally known to reflect light. In one advantageous embodiment, the light reflective optical layer 810 or the stress balancing layer 820 comprise a metal light reflective optical layer. In such an embodiment, the metal may comprise any metallic material that reflects light with high reflectivity. For example, in an exemplary embodiment, the light reflective optical layer 810 or the stress balancing layer 820 may comprise gold, silver, rhodium, platinum, copper or aluminum. While it is required that the light reflective optical layer 810 comprise a reflective material, the stress balancing layer 820 may comprise materials that are non-reflective.

The light reflective optical layer 810 and the stress balancing layer 820 may be formed using many processes. For instance, they can be deposited by known thin film deposition methods, such as evaporation, sputtering, ion-beam, electrochemical or electroless deposition, or chemical vapor deposition. Moreover, they may typically be formed to a thickness ranging from about 20 nm to about 2000 nm. Similar thin film deposition techniques may be applied to fabricate the diffusion barrier layer 720 and the adhesion layers, as well.

Turning to FIGS. 9 and 10, with continued reference to FIG. 5, illustrated are two graphs 900 and 1000 showing benefits that may arise from using the diffusion barrier layer 540. FIG. 9 represents curvature of the mirror 510 versus temperature for several temperature cycles, when using a palladium barrier layer on both sides, and aluminum for the light reflective optical layer 550 and the stress balancing layer 560. In the particular example illustrated in FIG. 9, a 3000 nm silicon substrate has a 4 nm titanium adhesion layer formed on both sides thereof. Additionally, a 5 nm palladium layer is formed on both of the titanium adhesion layers, and an 80 nm aluminum layer is evaporated on the palladium layers. As can be noticed, the mirror 510 might begin with a small curvature, however, after an initial increase in temperature to about 160° C., the mirror 510 remains substantially flat and experiences substantially reduced temperature dependent curvature.

Turning to FIG. 10, graph 1000 represents curvature of the mirror 510 versus temperature, when using a platinum barrier layer, and aluminum for the light reflective optical layer 550 and the stress balancing layer 560. In the particular example illustrated in FIG. 10, a 3000 nm silicon substrate has a 4 nm titanium adhesion layer formed on both sides thereof. Additionally, a 5 nm platinum layer is formed on both of the titanium adhesion layers, and an 80 nm aluminum layer is evaporated on the platinum layers. As is illustrated, the mirror 510 experiences reduced temperature dependent curvature after an initial increase in temperature up to about 160° C. While the mirror may contain a minor amount of curvature (e.g., 0.004 $mm^{-1}$), the curvature is constant and does not depend on temperature conditions. As long as the curvature remains within a predetermined value, such as less than about 0.02 $mm^{-1}$ and more preferably about 0.0025 $mm^{-1}$, and is not substantially temperature dependent, a small amount of curvature is acceptable.

Figure 11:
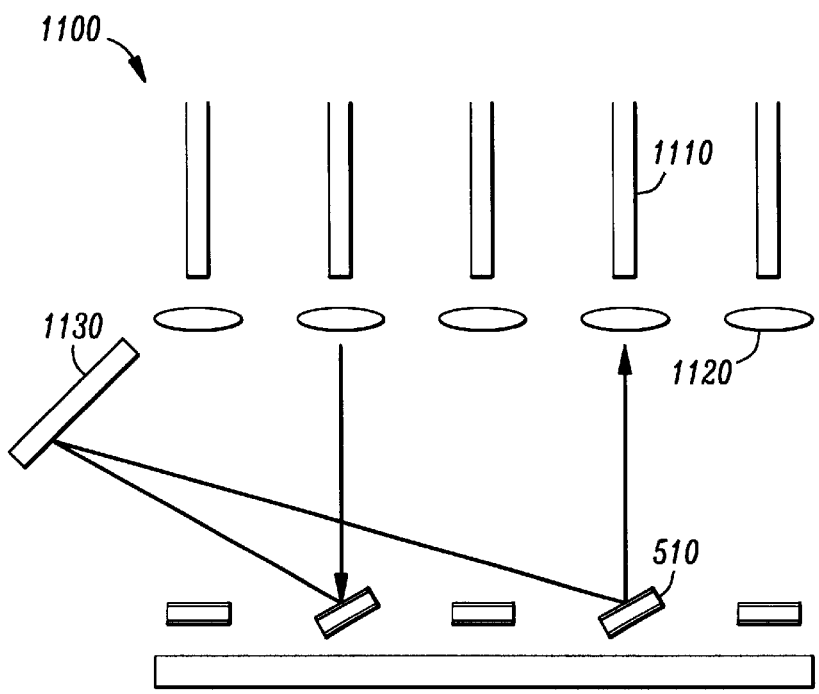
FIG. 11 illustrates an optical communications system, which provides one environment where the mirror may be used.

Turning to FIG. 11, illustrated is an optical communications system 1100. In the embodiment shown in FIG. 11, the optical communications system 1100 includes input/output fiber bundles 1110, the mirrors 510 illustrated in FIG. 5, imaging lenses 1120 interposed between the input/output fiber bundles 1110 and the mirrors 510, and a reflector 1130. The optical communications system 1100 represents an optical cross-connect, which is one environment where the mirror 510 may be used.

Figure 12:
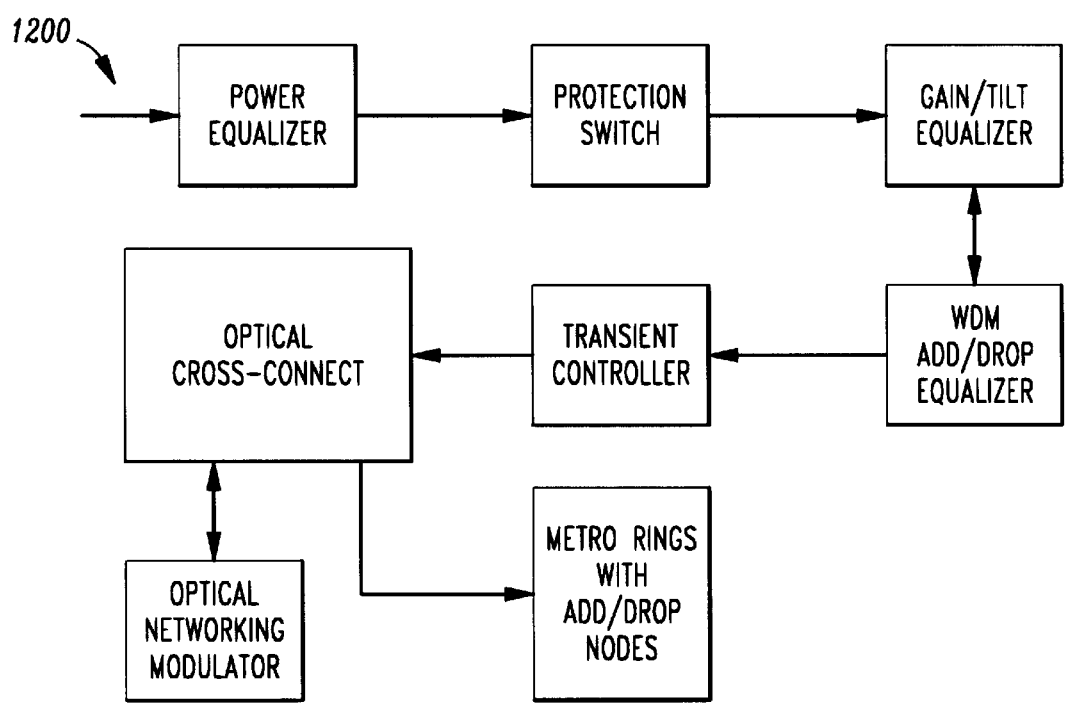
FIG. 12 illustrates an optical networking system incorporating the inventive mirror.

The inventive mirror 510, with stabilized mirror arrays, is useful not only for channel cross-connect, but also for signal re-routing, or signal modification in optical communication networking system. Schematically illustrated in FIG. 12 is an example of such a communication system 1200 comprising an optical cross connect, and other functional devices. In the cross connect, each mirror 510 receives a demultiplexed optical signal from an incoming channel, and reflects it toward an intended output channel location. The inventive mirror 510 is also useful for various other light-reflecting mirror systems, since the stability of mirror curvature is essential for reliable operation of most of the MEMS based optical devices. Examples of such devices include those shown in FIG. 12, such as power gain equalizers, switches, wavelength-division-multiplexer (WDM) add/drop devices, optical modulators and optical signal attenuators.

Multi-wavelength optical communication systems will require reconfiguration and reallocation of wavelengths among the various nodes of a network depending on user requirements, e.g., with programmable add/drop elements. One problem limiting the capacity of such systems is that the erbium-doped fiber amplifier, which is often a necessary component in optical communication systems, has a characteristic spectral dependence providing different gain for different wavelength channels. This spectral dependence poses a problem for multichannel WDM systems, because different gains for different channels leads to high bit error rates in some of the channels. As the number of channels passing through the amplifier changes by channel add/drop reconfiguration, the amplifier will start showing deleterious peaks in its gain spectrum at some wavelength channels, requiring modification of the signal spectrum and flattening of the amplifier gains.

One way of flattening the amplifier gain spectrum is to use long period fiber gratings. Long-period fiber grating devices provide wavelength dependent loss and may be used for spectral shaping. See an article by A. M. Vengsarkar et al., *Optical Letters* Vol.21, p.336, (1996).

A difficulty with conventional long-period gratings, however, is that their ability to dynamically equalize amplifier gain is limited, because they filter only a fixed wavelength acting as wavelength-dependent loss elements. Such dynamic gain equalizers based on reconfigurable long-period gratings have been disclosed, for example, in the U.S. Pat. No. 5,999,671 (Jin, et al.) It is desirable to be able to equalize amplifier gains over a broad range of wavelengths covering many wavelength channels. Therefore, it would be beneficial to utilize many simultaneously operating mirrors, similar to the mirror 510, each representing one specific demultiplexed wavelength. The design and size scale of the dynamic gain equalizer devices is tailored so that the range of wavelength spectrum and the number of wavelength channels simultaneously controllable, can be optimized and increased if necessary.

In a dynamic gain equalizer using the mirror 510, the optical signal gain in each wavelength channel can be independently, and simultaneously with other channels, controlled by a multitude of mirrors such as the mirror 510, which reflects that particular signal. The multiplexed optical signal is demultiplexed using suitable demultiplexers such as planar waveguides or thin film devices, with each of the separated wavelength channel signals being sent to each mirror 510 and reflected. By programmably selecting the tilt angle of relevant mirrors slightly off the angle of maximum signal reflection, the losses for various wavelength channels can be intentionally increased to different degrees for the purpose of gain equalizing. The stability of mirror curvature enhanced by the present invention is crucial in ensuring the accuracy of dynamic gain control by different mirrors.

Figure 13:
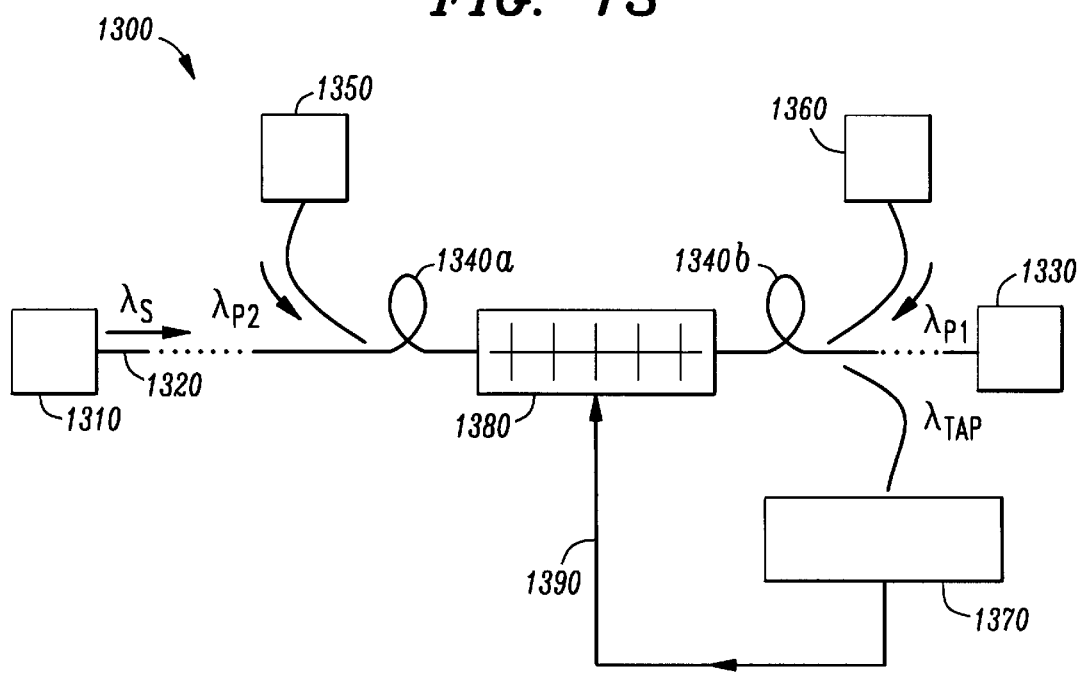
FIG. 13 illustrates an optical communication system comprising a dynamic gain equalizer according to the invention.

Referring to FIG. 13, illustrated is an exemplary gain equalizer system comprising the mirror 510 according to the invention. The system 1300 comprises dynamically gain-equalized optical amplifiers, a reconfigurable MEMS mirror-type spectral shaping device, and a feedback device. Specifically, the system 1300 comprises a transmitter source 1310 of optical signals, such as a digitally modulated 1.55 µm signal, an optical signal path comprising a length of optical fiber 1320 for transmitting the signal, and a receiver 1330 for receiving and demodulating the signal. One or more optical amplifiers, such as erbium-doped fiber amplifiers 1340a, 1340b, are disposed in the optical signal path for amplifying the transmitted signal. The amplifiers are pumped by pump sources 1350, 1360, of optical energy having pump wavelengths $\lambda_{p1}$ and $\lambda_{p2}$.

One of the preferred uses of the device of FIG. 13 is to reduce spectral dependence in the gain output of an optical amplifier. For example, the characteristic gain spectrum of an erbium-doped optical fiber amplifier has a pair of gain peaks at about 1.53 µm and at about 1.56 µm. Thus, a signal at 1.53 µm will be amplified more than one at 1.54 µm, which would be disadvantageous in a wavelength division multiplexing (WDM) system.

By properly demultiplexing the optical signal and sending it to different light-reflecting mirrors for separately programmed attenuation of signal strengths, and by optional tuning of the mirror reflections via a feedback system, the gain spectrum of the amplifier device combination can be made substantially flat over a range of wavelengths. The tunable system 1380 comprises a demultiplexer in combination with a tunable light-reflecting MEMS mirror device and a multiplexer to put together the different wavelength channels into the optical fiber. The device 1380 is connected to a feedback system 1390, having a wavelength detector 1370 coupled to the fiber 1320 for detecting the wavelength response $\lambda_{tap}$. The feedback system 1390 automatically adjusts the tuning of the device 1380 depending upon $\lambda_{tap}$. Advantageously, system 1300 can be a WDM system using a plurality of different wavelength signals, e.g., $\lambda_{s1}$ and $\lambda_{s2}$, and a plurality of tunable MEMS mirror devices coupled to one or more detectors.

The mirror 510 can also be useful as a multi-channel optical add/drop device. Modern, high-density optical communications utilize wavelength division multiplexed communication systems which employ multiplexer/demultiplexer devices. In such systems, a "trunk" fiber carries optical signal channels at several wavelengths $\lambda_1$, $\lambda_2$, ... $\lambda_n$ and it is desirable to extract a single wavelength channel from the trunk fiber or to add a single wavelength channel onto the trunk. A wide variety of such devices can be made, for example, by interconnecting optical circulators and tunable fiber Bragg gratings. See, U.S. Pat. No. 5,781,677 by Jin et al. Typically, the channel reflected by the grating is dropped to the trunk fiber or is added to the trunk. Gratings as described herein permit selection at the grating of which channel is dropped or added. In the case of MEMS based devices, an array of mirrors such as the mirror 510, allows channel add/drop operation in a free-space mode thus providing a convenient capability to carry out the add/drop operations for many hundreds or even thousands of channels simultaneously, thus providing a much enhanced capability as compared to the grating-based add/drop systems.

Filters and attenuators are useful in communication systems to change the power levels of various signals. In modern communications systems, variable attenuators are becoming increasingly more important, especially in dense wavelength-division multiplexed (DWDM) systems. Variable attenuators are used to vary the amount of loss light will experience as it passes through the system. This loss may range from low loss (<1 dB), to very high loss (>30 dB). The mechanism by which the attenuators induce loss in the signals may be attributable to coupling loss between fibers, polarization loss, absorption loss, scattering loss, or any combination of these.

Figure 14:
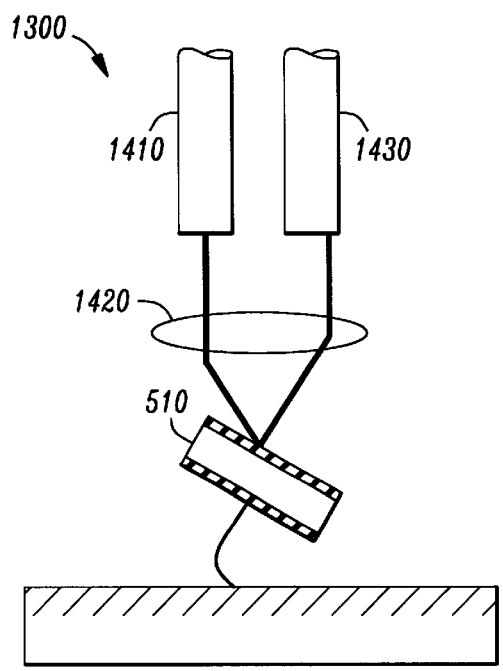
FIG. 14 illustrates an optical signal modulator comprising the improved mirror, according to the invention.

Variable attenuators typically have involved use of bulk moving parts and are not always amenable to small, high-density device arrays. As may be appreciated, those concerned with the development of optical communications systems continually search for new components and designs including new attenuator designs. As optical communications systems become more advanced, there is growing interest in reducing the dimension of the attenuator devices, and in increasing the number of wavelength channels that may be transmitted, relayed, modulated/attenuated, filtered, or switched. The instant invention comprising the mirror 510, such as schematically illustrated in FIG. 14, provides a variable attenuator device that may be used to reliably achieve desired signal attenuation in many channels. Here, the movable MEMS mirrors are advantageously used to intentionally misalign the reflecting light beam relative to the output fiber core location, essentially obtaining signal attenuation. Also included within the embodiment shown in FIG. 14, are a first fiber optic line 1410, a lense 1420, the mirror 510 and a second offset fiber optic line 1430.

The inventive methods and structures can also be applied to devices which are not MEMS type devices. Any light-reflecting system comprising a mirror or an array of mirrors with the light reflective optical layer 550 and the stress balancing layer 560, can be improved by the insertion of the diffusion barrier layer 540. For example, the mirror size may be larger than about 1 cm in diameter. It should further be understood that the above-described embodiments are illustrative of only a few of the many possible specific embodiments which may represent applications of the present invention. Numerous and varied other arrangements can be made by those skilled in the art without departing from the spirit and scope of the present invention.

Although the present invention has been described in detail, those skilled in the art should understand that they can make various changes, substitutions and alterations herein without departing from the spirit and scope of the invention in its broadest form.

What is claimed is:

1. For use with a micro-electro-mechanical system (MEMS) optical device, a device comprising a mirror wherein the mirror comprises:
    a substrate having opposing first and second sides;
    a first diffusion barrier layer located over the first side;
    a second diffusion barrier layer located over the second side;
    a stress balancing layer located over the second diffusion barrier layer; and
    a light reflective optical layer located over the first diffusion barrier layer.

2. The device as recited in claim 1 wherein the diffusion barrier layer has a thickness ranging from about 0.5 nm to about 500 nm.

3. The device as recited in claim 2 wherein the diffusion barrier layer has a thickness ranging from about 5 nm to about 50 nm.

4. The device as recited in claim 1 wherein the diffusion barrier layer comprises a metal.

5. The device as recited in claim 1 wherein the diffusion barrier layer comprises a refractory metal or platinum group metal wherein the metal is selected from the group consisting of tungsten, molybdenum, zirconium, niobium, hafnium, platinum, palladium, rhodium, iridium, osmium or any alloys containing at least about 30 atomic percent thereof.

6. The device as recited in claim 1 wherein the diffusion barrier layer is an oxide, nitride, carbide, or fluoride selected from the group of materials consisting of magnesium oxide, calcium oxide, titanium dioxide, aluminum oxide, chromium oxide, zirconium dioxide, silicon nitride, aluminum nitride, titanium nitride, zirconium nitride, hafnium nitride, tungsten carbide, silicon carbide, zirconium carbide, titanium carbide, magnesium fluoride, or calcium fluoride.

7. The device as recited in claim 1 further including an adhesion layer located between the substrate and the diffusion barrier layer.

8. The device as recited in claim 7 wherein the adhesion layer comprises a material selected from the group consisting of titanium, chromium, zirconium, hafnium, or niobium.

9. The device as recited in claim 1 wherein the diffusion barrier layer reduces an amount of diffusion between the light reflective optical layer and the substrate by more than about 80%.

10. A method of manufacturing a micro-electro-mechanical system (MEMS) optical device, comprising:
    forming a substrate having opposing first and second sides;
    forming a first diffusion barrier layer over the first side
    forming a second diffusion barrier layer over the second side;
    forming a stress balancing layer over the second diffusion barrier layer; and
    forming a light reflective optical layer over the first diffusion barrier layer.

11. The method as recited in claim 10 wherein forming a diffusion barrier layer includes forming a diffusion barrier layer having a thickness ranging from about 0.5 nm to about 500 nm.

12. The method as recited in claim 11 wherein forming a diffusion barrier layer having a thickness ranging from about 0.5 nm to about 500 nm includes forming a diffusion barrier layer having a thickness ranging from about 5 nm to about 50 nm.

13. The method as recited in claim 10 wherein forming a diffusion barrier layer includes forming a metal diffusion barrier layer.

14. The method as recited in claim 10 wherein forming a diffusion barrier layer includes forming a refractory metal or platinum group metal, wherein the metal is selected from the group consisting of tungsten, molybdenum, zirconium, niobium, hafnium, platinum, palladium, rhodium, iridium, osmium or any alloys containing at least about 30 atomic percent thereof.

15. The method as recited in claim 10 wherein forming a diffusion barrier layer includes forming a diffusion barrier layer that is an oxide, nitride, carbide, or fluoride selected from the group of materials consisting of magnesium oxide, calcium oxide, titanium dioxide, aluminum oxide, chromium oxide, zirconium dioxide, silicon nitride, aluminum nitride, titanium nitride, zirconium nitride, hafnium nitride, tungsten carbide, silicon carbide, zirconium carbide, titanium carbide, magnesium fluoride, or calcium fluoride.

16. The method as recited in claim 10 further including forming an adhesion layer between the substrate and the diffusion barrier layer.

17. The method as recited in claim 10 wherein forming a diffusion barrier layer includes forming a diffusion barrier layer that reduces an amount of diffusion between the light reflective optical layer and the substrate by more than about 80%.

18. A micro-electro-mechanical system (MEMS) optical device, comprising: a mirror, including;
    a substrate having opposing first and second sides;
    a first diffusion barrier layer located over the first side;
    a second diffusion barrier layer located over the second side;
    a stress balancing layer located over the second diffusion barrier layer; and
    a light reflective optical layer located over the first diffusion barrier layer; one or more actuating electrodes configured to controllably move the mirror; and a spacer which separates the mirror and the actuating electrodes.

19. The micro-electro-mechanical system (MEMS) optical device as recited in claim 18 wherein the mirror includes an array of mirrors coupled together that function as a unit.

20. The micro-electro-mechanical system (MEMS) optical device as recited in claim 18 wherein the diffusion barrier layer reduces an amount of diffusion between the light reflective optical layer and the substrate by more than about 80%.

* * * * *